(12) United States Patent
Jang et al.

(10) Patent No.: US 11,769,746 B2
(45) Date of Patent: Sep. 26, 2023

(54) SEMICONDUCTOR PACKAGE

(71) Applicant: SAMSUNG ELECTRONICS CO., LTD., Suwon-si (KR)

(72) Inventors: Ae-Nee Jang, Seoul (KR); KyungSeon Hwang, Incheon (KR); SunWon Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 17/189,405

(22) Filed: Mar. 2, 2021

(65) Prior Publication Data

US 2021/0183801 A1    Jun. 17, 2021

Related U.S. Application Data

(63) Continuation of application No. 16/244,661, filed on Jan. 10, 2019, now Pat. No. 10,943,881, which is a
(Continued)

(30) Foreign Application Priority Data

Dec. 21, 2015    (KR) .......................... 10-2015-0183052

(51) Int. Cl.
*H01L 23/00* (2006.01)
*H01L 21/56* (2006.01)
*H01L 23/48* (2006.01)

(52) U.S. Cl.
CPC .......... *H01L 24/14* (2013.01); *H01L 21/563* (2013.01); *H01L 23/481* (2013.01); *H01L 24/05* (2013.01); *H01L 24/10* (2013.01); *H01L 24/11* (2013.01); *H01L 24/12* (2013.01); *H01L 24/13* (2013.01); *H01L 24/73* (2013.01); *H01L 24/03* (2013.01); *H01L 24/06* (2013.01); *H01L 2224/0345* (2013.01); *H01L 2224/03912* (2013.01); *H01L 2224/0401* (2013.01);
(Continued)

(58) Field of Classification Search
CPC .................................................. H01L 24/04–17
See application file for complete search history.

(56) References Cited

U.S. PATENT DOCUMENTS 6,677,677 B2    1/2004 Kimura et al.
7,368,821 B2    5/2008 Kim et al.
(Continued)

FOREIGN PATENT DOCUMENTS

JP    2003-100801 A    4/2003
JP    2013-183120 A    9/2013
(Continued)

*Primary Examiner* — Jae Lee
(74) *Attorney, Agent, or Firm* — Lee IP Law, P.C.

(57) ABSTRACT

A semiconductor package includes a substrate, through-electrodes penetrating the substrate, first bumps spaced apart from each other in a first direction parallel to a top surface of the substrate and electrically connected to the through-electrodes, respectively, and at least one second bump disposed between the first bumps and electrically insulated from the through-electrodes. The first bumps and the at least one second bump constitute one row in the first direction. A level of a bottom surface of the at least one second bump from the top surface of the substrate is a substantially same as levels of bottom surfaces of the first bumps from the top surface of the substrate.

20 Claims, 7 Drawing Sheets

Related U.S. Application Data continuation of application No. 15/375,196, filed on Dec. 12, 2016, now Pat. No. 10,211,176.

(52) U.S. Cl.
CPC ............... *H01L 2224/05022* (2013.01); *H01L 2224/05025* (2013.01); *H01L 2224/0557* (2013.01); *H01L 2224/05155* (2013.01); *H01L 2224/05166* (2013.01); *H01L 2224/05171* (2013.01); *H01L 2224/05572* (2013.01); *H01L 2224/05582* (2013.01); *H01L 2224/05644* (2013.01); *H01L 2224/05647* (2013.01); *H01L 2224/05655* (2013.01); *H01L 2224/0603* (2013.01); *H01L 2224/06102* (2013.01); *H01L 2224/10125* (2013.01); *H01L 2224/1147* (2013.01); *H01L 2224/11462* (2013.01); *H01L 2224/11849* (2013.01); *H01L 2224/12105* (2013.01); *H01L 2224/131* (2013.01); *H01L 2224/13025* (2013.01); *H01L 2224/13082* (2013.01); *H01L 2224/13111* (2013.01); *H01L 2224/13144* (2013.01); *H01L 2224/13147* (2013.01); *H01L 2224/13155* (2013.01); *H01L 2224/13564* (2013.01); *H01L 2224/13582* (2013.01); *H01L 2224/14104* (2013.01); *H01L 2224/14515* (2013.01); *H01L 2224/14517* (2013.01); *H01L 2224/26145* (2013.01); *H01L 2224/73104* (2013.01); *H01L 2224/81191* (2013.01); *H01L 2224/81203* (2013.01); *H01L 2224/81815* (2013.01)

(56) References Cited

U.S. PATENT DOCUMENTS

| | | | |
|---|---|---|---|
| 7,691,747 | B2 | 4/2010 | Lin et al. |
| 8,513,802 | B2 | 8/2013 | Ma et al. |
| 8,759,950 | B2 | 6/2014 | Kamgaing et al. |
| 8,810,010 | B2 | 8/2014 | Kim |
| 9,128,148 | B2 | 9/2015 | Lowney et al. |
| 9,136,204 | B2 | 9/2015 | Ide |
| 9,209,156 | B2 | 12/2015 | Len et al. |
| 9,287,234 | B2 | 3/2016 | Wu et al. |
| 9,508,680 | B1 | 11/2016 | Ayotte et al. |
| 2002/0034066 | A1 | 3/2002 | Huang et al. |
| 2009/0085217 | A1* | 4/2009 | Knickerbocker ....... H01L 25/50 257/E23.141 |
| 2012/0118618 | A1 | 5/2012 | Min |
| 2012/0129333 | A1 | 5/2012 | Yim et al. |
| 2013/0140688 | A1 | 6/2013 | Chen et al. |
| 2013/0187292 | A1 | 7/2013 | Semmeemeyer et al. |
| 2013/0221519 | A1 | 8/2013 | Hwang et al. |
| 2013/0313690 | A1 | 11/2013 | Miyazaki |
| 2014/0044389 | A1 | 2/2014 | Uemura et al. |
| 2014/0131858 | A1 | 5/2014 | Pan et al. |
| 2015/0144390 | A1 | 5/2015 | Nejime |
| 2016/0086902 | A1 | 3/2016 | Lu et al. |
| 2016/0133542 | A1 | 5/2016 | Cha et al. |
| 2017/0141071 | A1 | 5/2017 | Choi et al. |

FOREIGN PATENT DOCUMENTS

| | | |
|---|---|---|
| JP | 2013247273 A | 12/2013 |
| JP | 2014103244 A | 6/2014 |
| KR | 10-2009-0056820 A | 6/2009 |
| KR | 10-2011-0091333 A | 8/2011 |
| KR | 10-2012-0057935 A | 6/2012 |
| KR | 20130096990 A | 9/2013 |
| KR | 10-2014-0028792 A | 3/2014 |
| KR | 10-2014-0042620 A | 4/2014 |
| KR | 10-2014-0061959 A | 5/2014 |
| KR | 10-2015-0062126 A | 6/2015 |
| KR | 10-2015-0072692 A | 6/2015 |
| KR | 10-1613173 B1 | 4/2016 |

\* cited by examiner

400
SEMICONDUCTOR PACKAGE

CROSS-REFERENCE TO RELATED APPLICATIONS

This is a continuation application based on pending application Ser. No. 16/244,661, filed on Jan. 10, 2019, which in turn is a continuation of application Ser. No. 15/375,196, filed on Dec. 12, 2016, now U.S. Pat. No. 10,211,176 B2, issued on Feb. 19, 2019, the entire contents of both being hereby incorporated by reference.

Korean Patent Application No. 10-2015-0183052, filed on Dec. 21, 2015, in the Korean Intellectual Property Office, and entitled: "Semiconductor Package," is incorporated by reference herein in its entirety.

BACKGROUND

1. Field

Embodiments relate to a semiconductor package.

2. Description of the Related Art

Light, small, high-speed, multi-functional, high-performance, and low-cost electronic products have been demanded with the development of an electronic industry. A multi-chip stacked package technique or a system in package technique may be used to satisfy these demands. A multi-chip stacked package or a system in package may perform functions of a plurality of unit semiconductor devices. The multi-chip stacked package or the system in package may be thicker than a general single-chip package but may have a similar size to the single-chip package in a plan view. Thus, the multi-chip stacked package or the system in package may be widely used in high-functional, small and portable electronic products such as a portable phone, a notebook computer, a memory card, and a portable camcorder.

SUMMARY

Embodiments are directed to a semiconductor package, including a substrate, through-electrodes penetrating the substrate, first bumps spaced apart from each other in a first direction parallel to a top surface of the substrate and electrically connected to the through-electrodes, respectively, and at least one second bump disposed between the first bumps and electrically insulated from the through-electrodes. The first bumps and the at least one second bump may constitute one row in the first direction. A level of a bottom surface of the at least one second bump from the top surface of the substrate may be a substantially same as levels of bottom surfaces of the first bumps from the top surface of the substrate.

Embodiments are also directed to a semiconductor package, including a substrate, through-electrodes penetrating the substrate, first bumps spaced apart from each other in a first direction parallel to a top surface of the substrate and electrically connected to the through-electrodes, respectively, at least one second bump disposed between the first bumps and electrically insulated from the through-electrodes, and an underfill covering the substrate, the first bumps, and the at least one second bump. The first bumps and the at least one second bump may constitute one row in the first direction. A level of a bottom surface of the at least one second bump from the top surface of the substrate may be higher than levels of bottom surfaces of the first bumps from the top surface of the substrate.

Embodiments are also directed to a semiconductor device, including a first substrate having an active device at a first surface thereof, a second substrate, the second substrate being bonded to a second surface of the first substrate, opposite the first surface, by a plurality of bumps, the bumps including first bumps that have electrical connections penetrating the first substrate to electrically connect to the active device and including second bumps interspersed between the first bumps, the second bumps being mounted on an insulating region of the second surface, the first and second bumps being spaced at a regular pitch, and an underfill layer interposed between the first and second substrates, and contacting the first and second bumps.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 1:
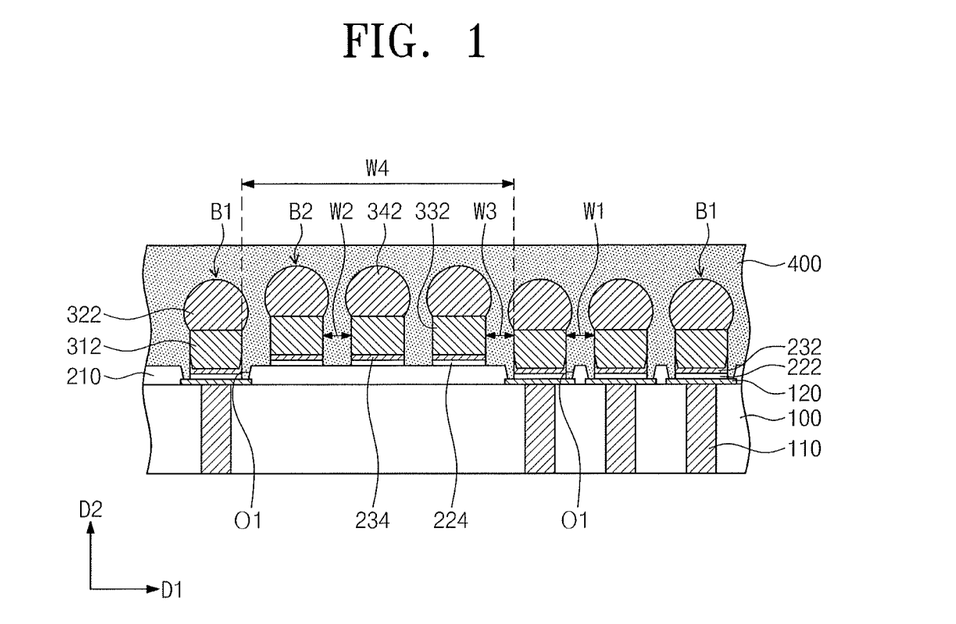
FIG. 1 illustrates a cross-sectional view of a semiconductor package according to some example embodiments.

FIG. 1 is a cross-sectional view of a semiconductor package according to some example embodiments.

Referring to FIG. 1, a substrate 100 may include a semiconductor material. For example, the substrate 100 may be a silicon (Si) substrate, a germanium (Ge) substrate, or a silicon-germanium (SiGe) substrate. An active region including a semiconductor device (or an integrated circuit) and an electrical path may be provided in an upper portion of the substrate 100.

A through-electrode 110 (e.g., a through-silicon via (TSV) electrode) may be provided in the substrate 100. The through-electrode 110 may penetrate the substrate 100. The through-electrode 110 may correspond to an electrical connection path between the active region (or the integrated circuit) and another semiconductor chip, or between the active region (or the integrated circuit) and a package substrate.

The through-electrode 110 may extend from a top surface to a bottom surface of the substrate 100. For example, the through-electrode 110 may extend in a second direction D2 perpendicular to the top surface of the substrate 100. A top surface of the through-electrode 110 may be substantially coplanar with the top surface of the substrate 100. A bottom surface of the through-electrode 110 may be substantially coplanar with the bottom surface of the substrate 100. The through-electrode 110 may be provided in plurality.

The plurality of through-electrodes 110 may be spaced apart from each other in the substrate 100. In some embodiments, the through-electrodes 110 may be arranged in a first direction D1 parallel to the top surface of the substrate 100. Intervals (or distances) between the through-electrodes 110 in the first direction D1 may not be equal to each other.

The through-electrode 110 may have a multi-layered structure. For example, the through-electrode 110 may have a multi-layered structure in which an insulating layer, a diffusion barrier layer, and a conductive layer are sequentially formed.

A pad 120 may be provided on the substrate 100. In some embodiments, the pad 120 may cover the top surface of the through-electrode 110 and may extend onto the top surface of the substrate 100. For example, a portion of a bottom surface of the pad 120 may be in contact with the top surface of the through-electrode 110, and the rest of the bottom surface of the pad 120 may be in contact with the top surface of the substrate 100. At least a portion of the pad 120 may overlap with the whole of the top surface of the through-electrode 110 when viewed from a plan view. The pad 120 may be provided in plurality. The plurality of pads 120 may be provided on the plurality of through-electrodes 110, respectively.

An insulating pattern 210 may be provided on the substrate 100. The insulating pattern 210 may have a through-hole O1 exposing at least a portion of a top surface of the pad 120. In some embodiments, the insulating pattern 210 may have a plurality of the through-holes O1. Each of the through-holes O1 may expose at least a portion of a top surface of a corresponding one of the pads 120. The insulating pattern 210 may cover a portion of the pad 120. For example, the insulating pattern 210 may cover an end portion or an edge of the pad 120.

A thickness of the insulating pattern 210 may be greater than that of the pad 120. A level of a top surface of the insulating pattern 210 from the substrate 100 may be higher than a level of the top surface of the pad 120 from the substrate 100. In the present specification, the term "level" is used with reference to a height from the top surface of the substrate 100.

A first bump B1 and a second bump B2 may be provided on the substrate 100. The first bump B1 may be provided on the pad 120. For example, a bottom surface of the first bump B1 may be in contact with the top surface of the pad 120, which is exposed by the through-hole O1. The first bump B1 may be electrically connected to the through-electrode 110.

The first bump B1 may include a first barrier pattern 222, a first seed pattern 232, a first pillar 312, and a first reflow solder 322.

The second bump B2 may be provided on the insulating pattern 210. For example, a bottom surface of the second bump B2 may be in contact with the top surface of the insulating pattern 210. The second bump B2 may be electrically insulated from the through-electrode 110.

The second bump B2 may include a second barrier pattern 224, a second seed pattern 234, a second pillar 332, and a second reflow solder 342.

The second bump B2 may be a dummy bump electrically insulated from another device or component. For example, no through-electrode may be provided for the second bump B2.

In some embodiments, the first bump B1 may be provided in plurality. For example, the plurality of first bumps B1 may be arranged in the first direction D1.

In an example embodiment, a distance in the first direction D1 between a pair of first bumps B1 adjacent to each other may be different from a distance in the first direction D1 between another pair of first bumps B1 adjacent to each other. For example, a distance W1 in the first direction D1 between the first bumps B1 immediately adjacent to each other may be smaller than a distance W4 in the first direction D1 between the first bumps B1 adjacent to each other with the second bump B2 interposed therebetween. The first bumps B1 being adjacent to each other with the second bump B2 interposed therebetween is described with reference to the first bump B1, the second bump B2, and the first bump B1 being arranged in the order named along the first direction D1.

In some embodiments, the second bump B2 may be provided in plurality. In some embodiments, a plurality of the second bumps B2 may be provided between the first bumps B1 adjacent to each other. The second bumps B2 may be arranged in the first direction D1. Thus, the second bumps B2 and the first bumps B1 may constitute one row in the first direction D1.

A distance W2 in the first direction D1 between the second bumps B2 immediately adjacent to each other may be substantially equal to or smaller than the distance W1 in the first direction D1 between the first bumps B1 immediately adjacent to each other. In some embodiments, a distance W3 in the first direction D1 between the second bump B2 and the first bump B1 immediately adjacent to each other may be substantially equal to or smaller than the distance W1 in the first direction D1 between the first bumps B1 immediately adjacent to each other.

An underfill 400 may be provided on the first bumps B1 and the second bumps B2. For example, the underfill 400 may be a non-conductive film (NCF) or non-conductive paste (NCP). The first and second bumps B1 and B2 may be covered with the underfill 400. In some embodiments, a top surface of the underfill 400 may be disposed at substantially the same level as the topmost portion of a top surface of the second bump B2, based on the top surface of the substrate 100. In some embodiments, as illustrated in FIG. 1, the top surface of the underfill 400 may be disposed at a higher level than the topmost portion of the top surface of the second bump B2, based on the top surface of the substrate 100.

When semiconductor chips are stacked on a package substrate, the underfill 400 may be provided between the semiconductor chips adjacent to each other, and/or between the package substrate and the semiconductor chip. For example, the underfill 400 may fill a space between the semiconductor chips adjacent to each other and/or a space between the package substrate and the semiconductor chip. The underfill 400 may protect the semiconductor chips and/or the package substrate. In addition, the underfill 400 may bond the semiconductor chip to the semiconductor chip adjacent thereto, and/or may bond the semiconductor chip to the package substrate adjacent thereto.

In general, the underfill 400 may have fluidity by heat and pressure in a process of bonding the semiconductor chips to each other or a process of bonding the semiconductor chip to the package substrate. For example, heat and pressure may be provided to the semiconductor chip and the package substrate, and thus the first reflow solder 322 may be melted. A melting point of the underfill 400 may be lower than that of the first reflow solder 322, and thus the underfill 400 may be melted together with the first reflow solder 322. The underfill 400 may flow in a direction outward from a central portion of the semiconductor chip when viewed from a plan view. Absent the presence of the second bumps B2, the flowing underfill 400 could apply enough pressure to the first reflow solder 322 so as to undesirably vary a shape of the first reflow solder 322, in which case electrical characteristics of the first reflow solder 322 may be deteriorated.

According to some example embodiments, the second bumps B2 may provide resistance to flow of the underfill 400. For example, the second bumps B2 and the first bumps B1 may constitute the one row to reduce a magnitude of the pressure applied to the first reflow solder 322 by the underfill 400. Thus, the shape of the first reflow solder 322 may be substantially maintained even though the underfill 400 flows. As a result, the first reflow solder 322 may have desired electrical characteristics.

A method of manufacturing a semiconductor package according to some example embodiments will be described hereinafter.

FIGS. 2 to 9 are cross-sectional views of stages in a method of manufacturing a semiconductor package according to some example embodiments.

Figure 2:
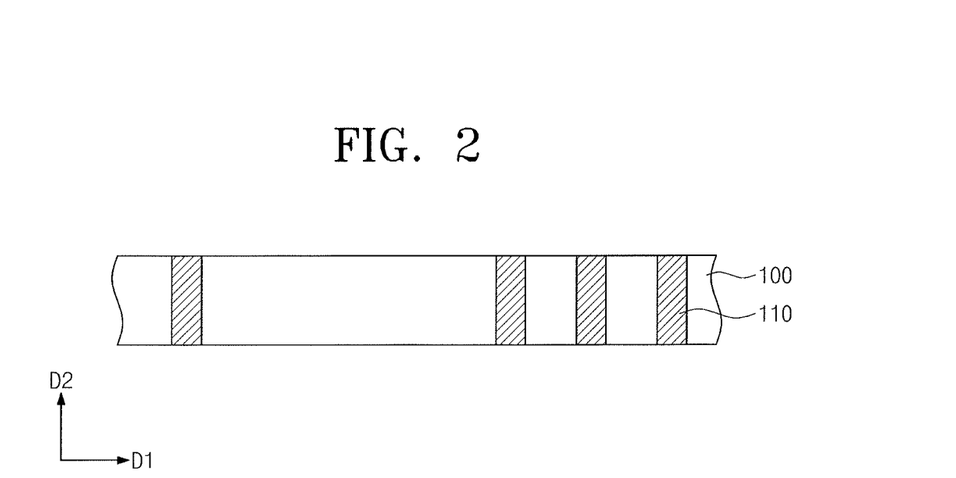
FIGS. 2 to 9 illustrate cross-sectional views of stages in a method of manufacturing a semiconductor package according to some example embodiments.

Referring to FIG. 2, a through-electrode 110 may be formed in a substrate 100. The substrate 100 may include a semiconductor material. For example, the substrate 100 may be a silicon (Si) substrate, a germanium (Ge) substrate, or a silicon-germanium (SiGe) substrate. The through-electrode 110 may be formed by a process of forming a through-silicon via or electrode-hole in the substrate 100, a process of depositing a conductive material layer to fill the electrode-hole, and a process of planarizing or etching the conductive material layer to expose a top surface of the substrate 100. In some embodiments, the electrode-hole may be formed using a dry etching process or a wet etching process. In some embodiments, the conductive material layer may be deposited by at least one of a chemical vapor deposition (CVD) process, a plasma enhanced CVD (PECVD) process, a high-density plasma CVD (HDP-CVD) process, a sputtering process, a metal organic CVD (MOCVD) process, or an atomic layer deposition (ALD) process. The through-electrode 110 may include a conductive material. For example, the through-electrode may include at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

Figure 3:
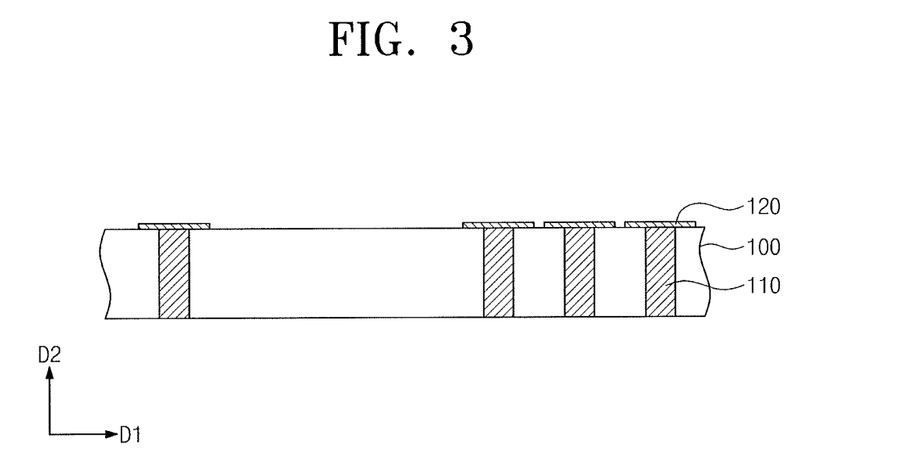

Referring to FIG. 3, a pad 120 may be formed on the through-electrode 110. In some embodiments, the pad 120 may be formed by a process of forming a metal layer and a process of removing a portion of the metal layer. The process of forming the metal layer may include at least one of a CVD process, a physical vapor deposition (PVD) process, or an ALD process. The process of removing a portion of the metal layer may include a process of patterning the metal layer using a patterning mask. The pad 120 may include a conductive material. For example, the pad 120 may include aluminum (Al), copper (Cu), gold (Au), silver (Ag), tin (Sn), chromium (Cr), palladium (Pd), or an alloy thereof. In some embodiments, the pad 120 may be provided in plurality. For example, the plurality of pads 120 may be formed on the plurality of through-electrodes 110, respectively.

Figure 4:
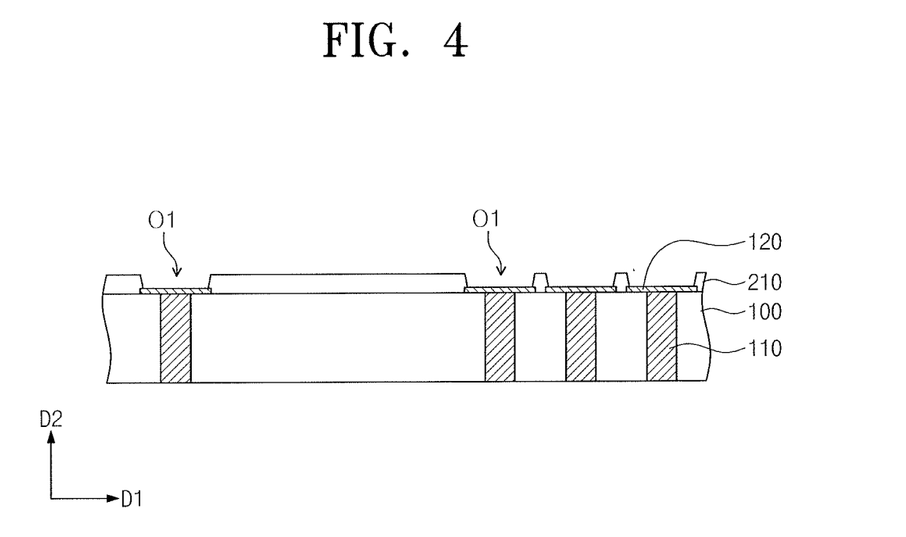

Referring to FIG. 4, an insulating pattern 210 may be formed on the substrate 100. The insulating pattern 210 may be formed by a process of forming an insulating layer and a process of patterning the insulating layer. The insulating layer may be formed on the substrate 100 by a deposition process. The insulating layer may cover the top surface of the substrate 100 and top surfaces and sidewalls of the pads 120. In some embodiments, the insulating layer may be deposited using at least one of a CVD process, a PVD process, or an ALD process. The process of patterning the insulating layer may include a process of etching the insulating layer using an etch mask. A through-hole O1 exposing a portion of the top surface of the pad 120 may be formed in the insulating layer by the etching process. The insulating layer including the through-hole O1 may be defined as the insulating pattern 210. After the etching process, the insulating pattern 210 may cover another portion of the top surface of the pad 120 and the sidewalls of the pad 120. In some embodiments, the insulating pattern 210 may include at least one of silicon nitride, silicon oxide, or silicon oxynitride. The insulating pattern 210 may protect the substrate 100 and may insulate the substrate 100 from the outside.

Figure 5:
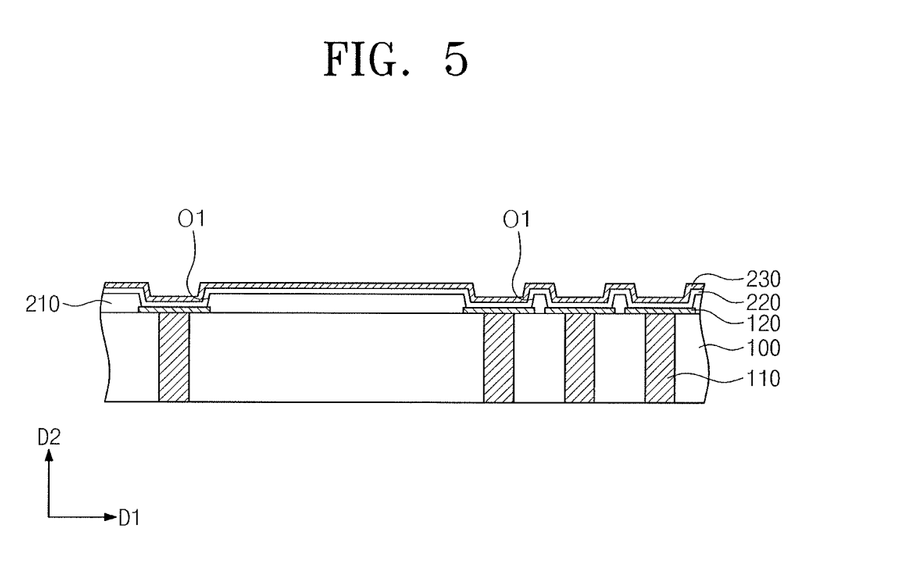

Referring to FIG. 5, a barrier layer 220 and a seed layer 230 may be sequentially formed on the insulating pattern 210 to fill the through-hole O1. The barrier layer 220 may conformally cover a top surface of the insulating pattern 210 and an inner surface of the through-hole O1. In some embodiments, the barrier layer 220 may be formed using a CVD process, a PVD process, or an ALD process. The barrier layer 220 may prevent a material included in the seed layer 230 from being diffused into a material (e.g., the insulating pattern 210) disposed under the barrier layer 220. In some embodiments, the barrier layer 220 may include at least one of chromium (Cr), nickel (Ni), titanium (Ti), or a titanium-tungsten (TiW) alloy. The seed layer 230 may extend along a top surface of the barrier layer 220. In some embodiments, the seed layer 230 may be formed using a CVD process, a PVD process, or an ALD process. In some embodiments, the seed layer 230 may include at least one of copper, nickel, or gold.

Figure 6:
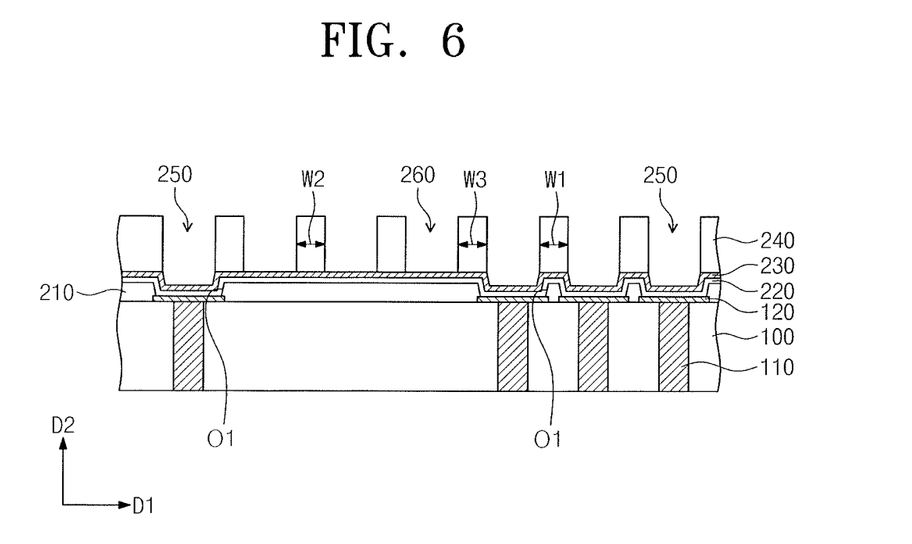

Referring to FIG. 6, a photoresist pattern 240 may be formed on the seed layer 230. The photoresist pattern 240 may be formed by a process of forming a photoresist layer and a process of patterning the photoresist layer. The process of forming the photoresist layer may include a process of coating a top surface of the seed layer 230 with a photoresist material and a process of baking the photoresist material. The process of patterning the photoresist layer may include a process of exposing a portion of the photoresist layer and a process of developing the exposed photoresist layer.

The photoresist pattern 240 may have a first opening 250 and a second opening 260. Each of the first and second openings 250 and 260 may expose a portion of the top surface of the seed layer 230. The first opening 250 may vertically overlap with the through-hole O1 of the insulating pattern 210. The first opening 250 may expose the top surface of the seed layer 230 disposed at a relatively low level. The first opening 250 may be provided in plurality. Each of the first openings 250 may vertically overlap with a corresponding one of the through-holes O1 of the insulating pattern 210. The photoresist pattern 240 between the first openings 250 immediately adjacent to each other may have a first width W1. The second opening 260 may expose the top surface of the seed layer 230 disposed at a relatively high level. The second opening 260 may be provided in plurality. The photoresist pattern 240 between the second openings 260 immediately adjacent to each other may have a second width W2. The photoresist pattern 240 between the first opening 250 and the second opening 260 immediately adjacent to each other may have a third width W3.

In some embodiments, the first width W1, the second width W2, and the third width W3 may be substantially equal to each other. In FIG. 5, the first width W1, the second width W2, and the third width W3 are widths in the first direction D1.

Figure 7:
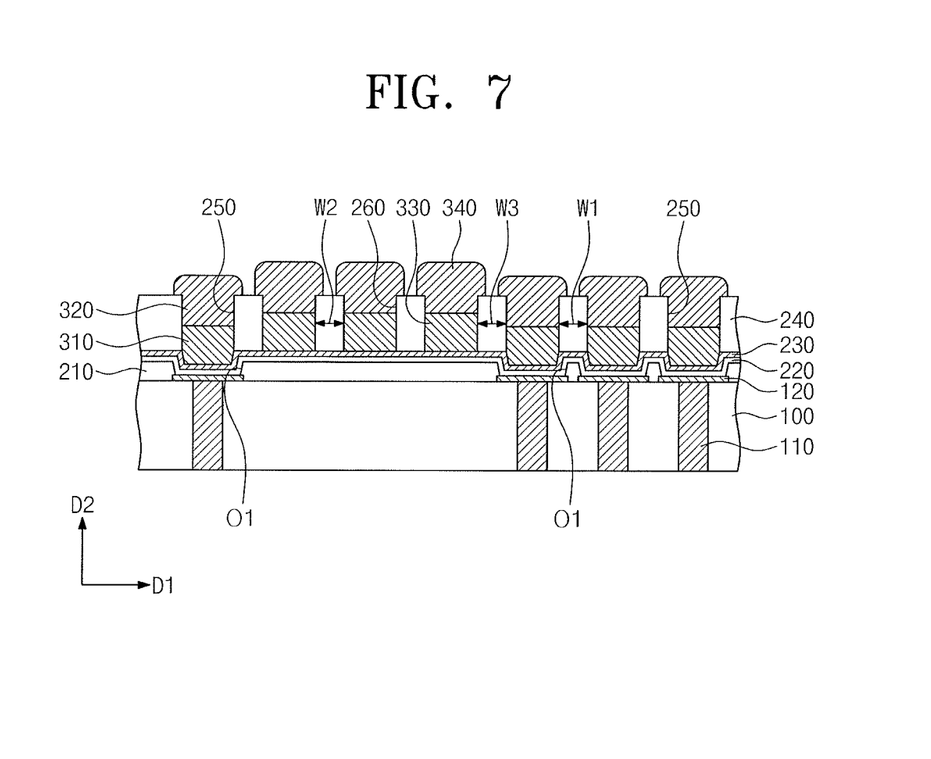

Referring to FIG. 7, a first pillar 310 may be formed in the first opening 250, and a second pillar 330 may be formed in the second opening 260. The first pillar 310 may fill a lower region of the first opening 250. For example, a bottom surface and a portion of a sidewall of the first pillar 310 may be in contact with the seed layer 230. At this time, the rest of the sidewall of the first pillar 310 may be in contact with an inner sidewall of the first opening 250. The second pillar 330 may fill a lower region of the second opening 260. A bottom surface of the second pillar 330 may be in contact with the top surface of the seed layer 230. For example, a sidewall of the second pillar 330 may be in contact with an inner sidewall of the second opening 260. In some embodiments, a distance W1 between the first pillars 310 immediately adjacent to each other may be substantially equal to a distance W2 between the second pillars 330 immediately adjacent to each other and a distance W3 between the first pillar 310 and the second pillar 330 immediately adjacent to each other. In some embodiments, the first and second pillars 310 and 330 may be formed by an electroplating process using the seed layer 230. The first and second pillars 310 and 330 may include at least one of copper (Cu), nickel (Ni), gold (Au), or an alloy thereof. Each of the first and second pillars 310 and 330 may have a single-layered structure or a multi-layered structure.

A first solder 320 and a second solder 340 may be formed on the first pillar 310 and the second pillar 330, respectively. In some embodiments, the first and second solders 320 and 340 may be formed using an electroplating process. Each of the first and second solders 320 and 340 may fill the rest of each of the first and second openings 250 and 260 (i.e., an upper region of each of the first and second openings 250 and 260) and may extend onto a top surface of the photoresist pattern 240. A sidewall of each of the first and second solders 320 and 340 may be in contact with the inner sidewall of each of the first and second openings 250 and 260. A top surface of each of the first and second solders 320 and 340 may be disposed at a higher level than the top surface of the photoresist pattern 240, based on the top surface of the substrate 100. The topmost end (or the topmost surface) of the second solder 340 may be disposed at a higher level than the topmost end (or the topmost surface) of the first solder 320. In some embodiments, the first and second solders 320 and 340 may include a tin-silver (SnAg) alloy. In certain embodiments, the first and second solders 320 and 340 may include a material obtained by adding at least one of copper (Cu), palladium (Pd), bismuth (Bi), or antimony (Sb) to the tin-silver (SnAg) alloy.

Figure 8:
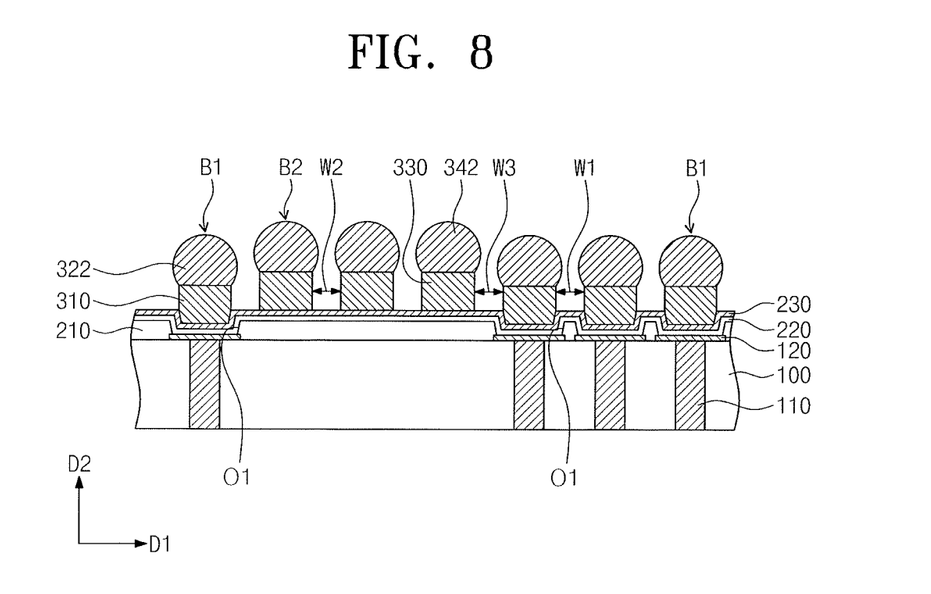

Referring to FIG. 8, the photoresist pattern 240 may be removed to expose the top surface of the seed layer 230 between the first and second pillars 310 and 330. Additionally, since the photoresist pattern 240 is removed, the sidewalls of the first and second solders 320 and 340 may also be exposed. In some embodiments, the photoresist pattern 240 may be removed by a strip process and/or an ashing process.

First and second reflow solders 322 and 342 may be formed on the first and second pillars 310 and 330, respectively. The first and second reflow solders 322 and 342 may be formed by performing a reflow process on the first and second solders 320 and 340 described with reference to FIG. 7. Each of the first and second reflow solders 322 and 342 may have a curved surface. For example, the topmost end of the second reflow solder 342 may be disposed at a higher level than the topmost end of the first reflow solder 322.

Figure 9:
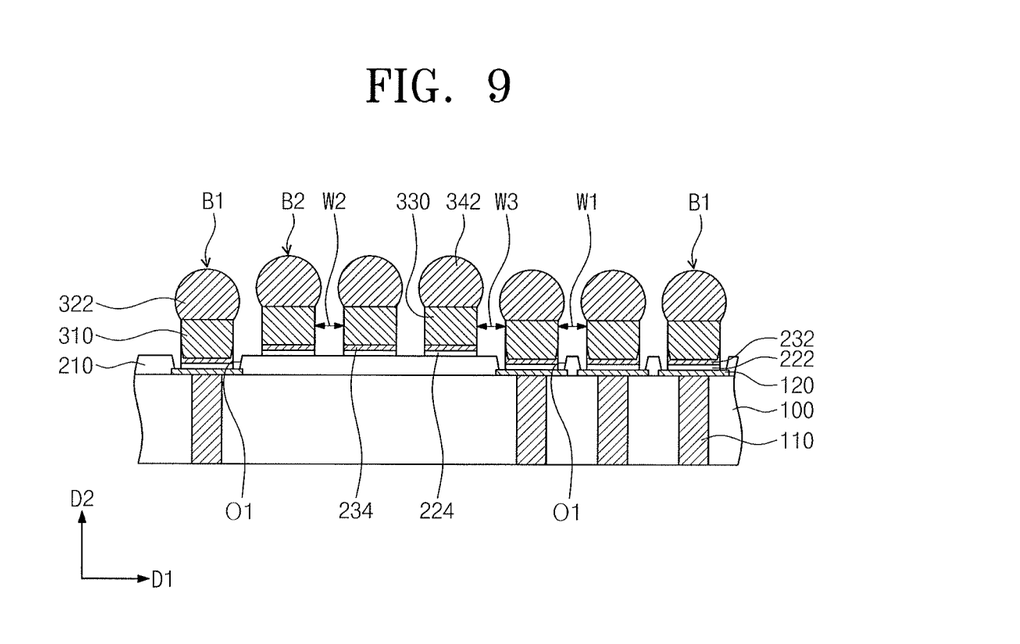

Referring to FIG. 9, first and second seed patterns 232 and 234 may be formed under the first and second pillars 310 and 330, respectively. Top surfaces of the first and second seed patterns 232 and 234 may be in contact with the bottom surfaces of the first and second pillars 310 and 330, respectively. Sidewalls of the first and second seed patterns 232 and 234 may be substantially coplanar with the sidewalls of the first and second pillars 310 and 330, respectively. First and second barrier patterns 222 and 224 may be formed under the first and second seed patterns 232 and 234, respectively. A bottom surface of the first barrier pattern 222 may be in contact with the top surface of the pad 120. A bottom surface of the second barrier pattern 224 may be in contact with the top surface of the insulating pattern 210. Sidewalls of the first and second barrier patterns 222 and 224 may be substantially coplanar with the sidewalls of the first and second pillars 310 and 330, respectively. A portion of the seed layer 230 exposed by the pillars 310 and 330 and a portion of the barrier layer 220 disposed under the exposed portion of the seed layer 230 may be removed to form the first and second seed patterns 232 and 234 and the first and second barrier patterns 222 and 224. In some embodiments, the portions of the seed layer 230 and the barrier layer 220 may be removed by a wet etching process using an etching solution (e.g., hydrogen peroxide ($H_2O_2$)).

The first barrier pattern 222, the first seed pattern 232, the first pillar 310, and the first reflow solder 322 may be defined as a first bump B1. The first bump B1 may be electrically connected to the through-electrode 110 and an integrated circuit of the substrate 100. Thus, the first bump B1 may correspond to an electrical path between the through-electrode 110 and an external chip. The second barrier pattern 224, the second seed pattern 234, the second pillar 330, and the second reflow solder 342 may be defined as a second bump B2. The second bump B2 may be electrically insulated from the through-electrode 110 and the integrated circuit of the substrate 100.

Referring again to FIG. 1, an underfill 400 may be provided on the substrate 100 to cover the first bump B1, the second bump B2, the pad 120, and the insulating pattern 210. The underfill 400 may protect the first and second bumps B1 and B2 and the substrate 100 and may connect or bond the substrate 100 to another substrate. For example, the underfill 400 may be a non-conductive film (NCF) or non-conductive paste (NCP). In some embodiments, the NCF may be formed on the substrate 100 by a laminating process.

Hereinafter, a semiconductor package according to some example embodiments will be described with reference to FIG. 10.

Figure 10:
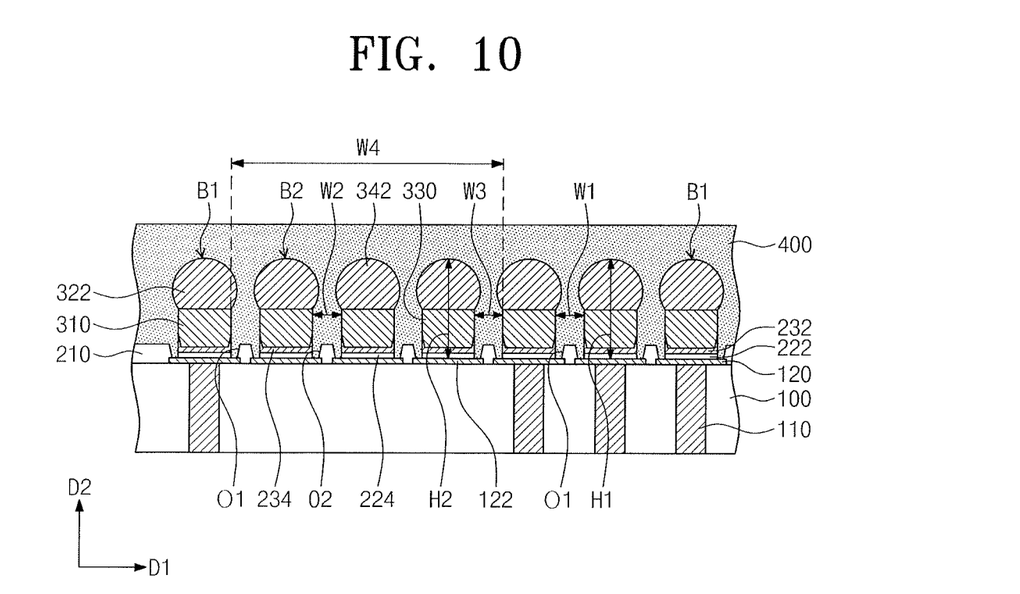
FIG. 10 illustrates a cross-sectional view of a semiconductor package according to some example embodiments.

FIG. 10 is a cross-sectional view illustrating a semiconductor package according to some example embodiments. Except for a second bump B2, an insulating pattern 210, and a pad 120, other components of the semiconductor package of FIG. 10 may be the substantially same as corresponding ones of the semiconductor package of FIG. 1.

Referring to FIG. 10, a first pad 120 and a second pad 122 may be provided on a substrate 100. The first pad 120 may be the same as the pad 120 described with reference to FIG. 1. In some embodiments, except for a position of the second pad 122, other features of the second pad 122 may be the substantially same as corresponding features of the first pad 120. A bottom surface of the second pad 122 may be in contact with the top surface of the substrate 100. A top surface of the second pad 122 may be disposed at the same level as a top surface of the first pad 120, based on the top surface of the substrate 100. The second pad 122 may be disposed on the substrate 100 between the through-electrodes 110 and may be disposed between the first pads 120 when viewed from a plan view. In some embodiments, the second pad 122 may be spaced apart from the first pad 120 in the first direction D1. In some embodiments, the second pad 122 may be provided in plurality. The second pads 122 may be spaced apart from each other in the first direction D1. Thus, the first pads 120 and the second pads 122 may constitute one row in the first direction D1. The second pad 122 may be electrically insulated from the through-electrode 110.

An insulating pattern 210 having a first through-hole O1 and a second through-hole O2 may be provided on the substrate 100. The first through-hole O1 may be the substantially same as the through-hole O1 described with reference to FIG. 1. The second through-hole O2 may expose at least a portion of the top surface of the second pad 122. In some embodiments, the insulating pattern 210 may cover end portions or edges of the first and second pads 120 and 122.

A first bump B1 may be provided on the first pad 120. A lower portion of the first bump B1 may be disposed in the first through-hole O1. A bottom surface of the first bump B1 may be in contact with the top surface of the first pad 120. The first bump B1 may be electrically connected to the through-electrode 110. A second bump B2 may be provided on the second pad 122. A lower portion of the second bump B2 may be disposed in the second through-hole O2. A bottom surface of the second bump B2 may be in contact with the top surface of the second pad 122. The second bump B2 may be electrically insulated from the through-electrode 110 and the integrated circuit of the substrate 100. The bottom surface of the second bump B2 may be disposed at the substantially same level as the bottom surface of the first bump B1, based on the top surface of the substrate 100. Each of the first and second bumps B1 and B2 may have a thickness in the second direction D2. The thickness H1 of the first bump B1 may be substantially equal to the thickness H2 of the second bump B2. Thus, the topmost end of the first bump B1 may be disposed at the same level as the topmost end of the second bump B2, based on the top surface of the substrate 100.

In some embodiments, the first bump B1 may be provided in plurality and the second bump B2 may be provided in plurality. The plurality of first bumps B1 and the plurality of second bumps B2 may be arranged in the first direction D1. The first and second bumps B1 and B2 may constitute one row in the first direction D1.

In some embodiments, some of the first bumps B1 may be immediately adjacent to each other. The immediately adjacent first bumps B1 may be spaced apart from each other by a first distance W1 in the first direction D1. In some embodiments, some of the second bumps B2 may be immediately adjacent to each other. The immediately adjacent second bumps B2 may be spaced apart from each other by a second distance W2 in the first direction D1. In some embodiments, the second distance W2 may be substantially equal to or smaller than the first distance W1. The first bump B1 and the second bump B2 immediately adjacent to each other may be spaced apart from each other by a third distance W3 in the first direction D1. In some embodiments, the third distance W3 may be substantially equal to or smaller than the first distance W1. The first bumps B1 adjacent to each other with at least one second bump B2 interposed therebetween may be spaced apart from each other by a fourth distance W4 in the first direction D1. Thus, the at least one second bump B2 may be disposed between the first bumps B1 spaced apart from each other by the fourth distance W4.

An underfill 400 covering the first and second bumps B1 and B2 may be provided on the substrate 100. For example, the underfill 400 may be a non-conductive film (NCF) or non-conductive paste (NCP). The underfill 400 may be the substantially same as the underfill 400 described with reference to FIG. 1. According to some example embodiments, an influence of the flow of the underfill 400 on the reflow solder 322 of the first bump B1 may be weakened by the second bump B2. Thus, the shape of the reflow solder 322 of the first bump B1 may be maintained.

Hereinafter, a method of manufacturing a semiconductor package according to some example embodiments will be described with reference to FIGS. 11 and 12.

Figure 11:
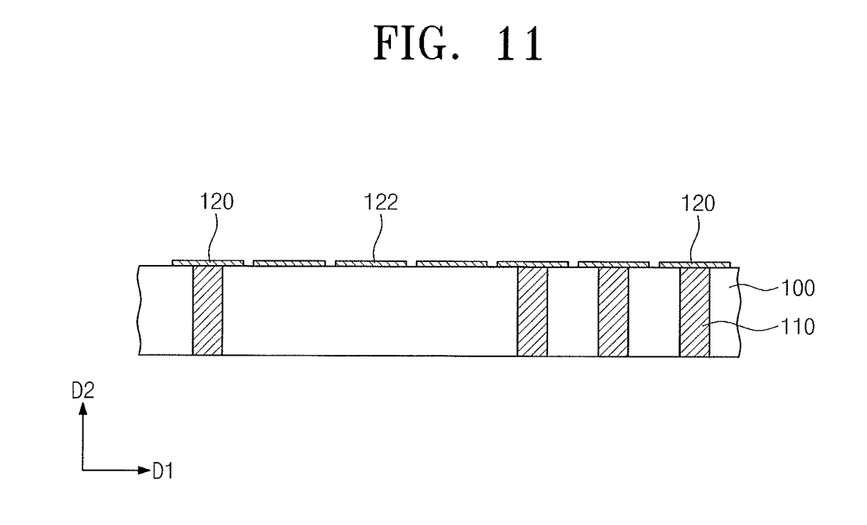
FIGS. 11 and 12 illustrate cross-sectional views of stages in a method of manufacturing a semiconductor package according to some example embodiments.
Figure 12:
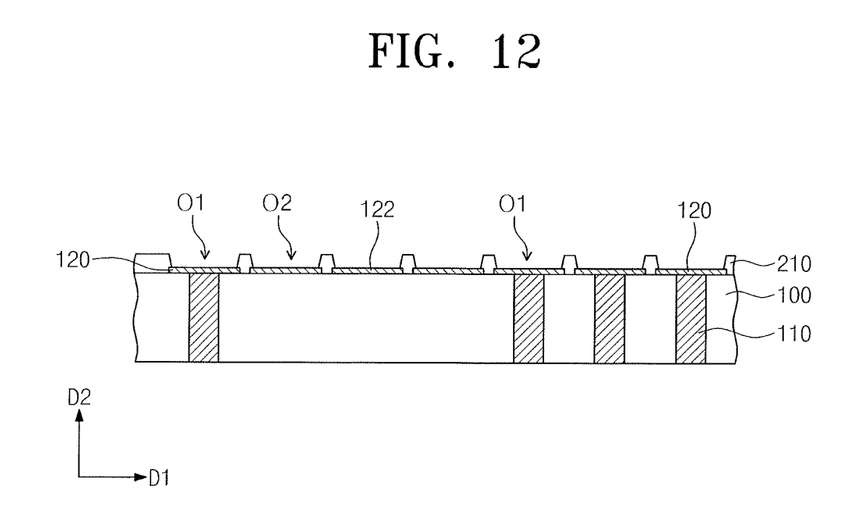

FIGS. 11 and 12 are cross-sectional views of stages in a method of manufacturing a semiconductor package according to some example embodiments. In the present embodiment, the descriptions to the same elements and technical features as in the embodiments of FIGS. 1 to 9 may be omitted or mentioned briefly for the purpose of ease and convenience in explanation.

Referring to FIG. 11, a first pad 120 and a second pad 122 may be formed on a substrate 100 that includes a through-electrode 110. The through-electrode 110 may be formed by the same method as described with reference to FIG. 2.

In some embodiments, the first pad 120 and the second pad 122 may be formed by a process of forming a metal layer and a process of removing a portion of the metal layer. In some embodiments, the process of forming the metal layer may include at least one of a CVD process, a PVD process, or an ALD process. The process of removing a portion of the metal layer may include a process of patterning the metal layer using a patterning mask. The first and second pads 120 and 122 may include a conductive material. For example, the first and second pads 120 and 122 may include aluminum (Al), copper (Cu), gold (Au), silver (Ag), tin (Sn), chromium (Cr), palladium (Pd), or an alloy thereof.

The first pad 120 may be electrically connected to the through-electrode 110. The second pad 122 may be electrically insulated from the through-electrode 110. The second pad 122 may be provided on the substrate 100 between the through-electrodes 110.

Referring to FIG. 12, an insulating pattern 210 may be formed on the substrate 100. The insulating layer may cover the top surface of the substrate 100 and top surfaces and sidewalls of the first and second pads 120 and 122.

The insulating pattern 210 may be formed by a process of forming an insulating layer and a process of patterning the insulating layer. The insulating layer may be formed on the substrate 100 by a deposition process. In some embodiments, the insulating layer may be deposited using at least one of a CVD process, a PVD process, or an ALD process. The process of patterning the insulating layer may include a process of etching the insulating layer using an etch mask. A first through-hole O1 and a second through-hole O2 may be formed in the insulating layer by the etching process. The first through-hole O1 may expose a portion of the top surface of the first pad 120, and the second through-hole O2 may expose a portion of the top surface of the second pad 122. The insulating layer including the first and second through-holes O1 and O2 may be defined as the insulating pattern 210. After the etching process, the insulating pattern 210 may cover other portions of the top surfaces of the first and second pads 120 and 122 and the sidewalls of the first and second pads 120 and 122. In some embodiments, the insulating pattern 210 may include at least one of silicon nitride, silicon oxide, or silicon oxynitride. The insulating pattern 210 may protect the substrate 100 and may insulate the substrate 100 from the outside.

A first bump B1, a second bump B2, and an underfill 400 may be formed by the same processes described with reference to FIGS. 1 to 9.

Figure 13:
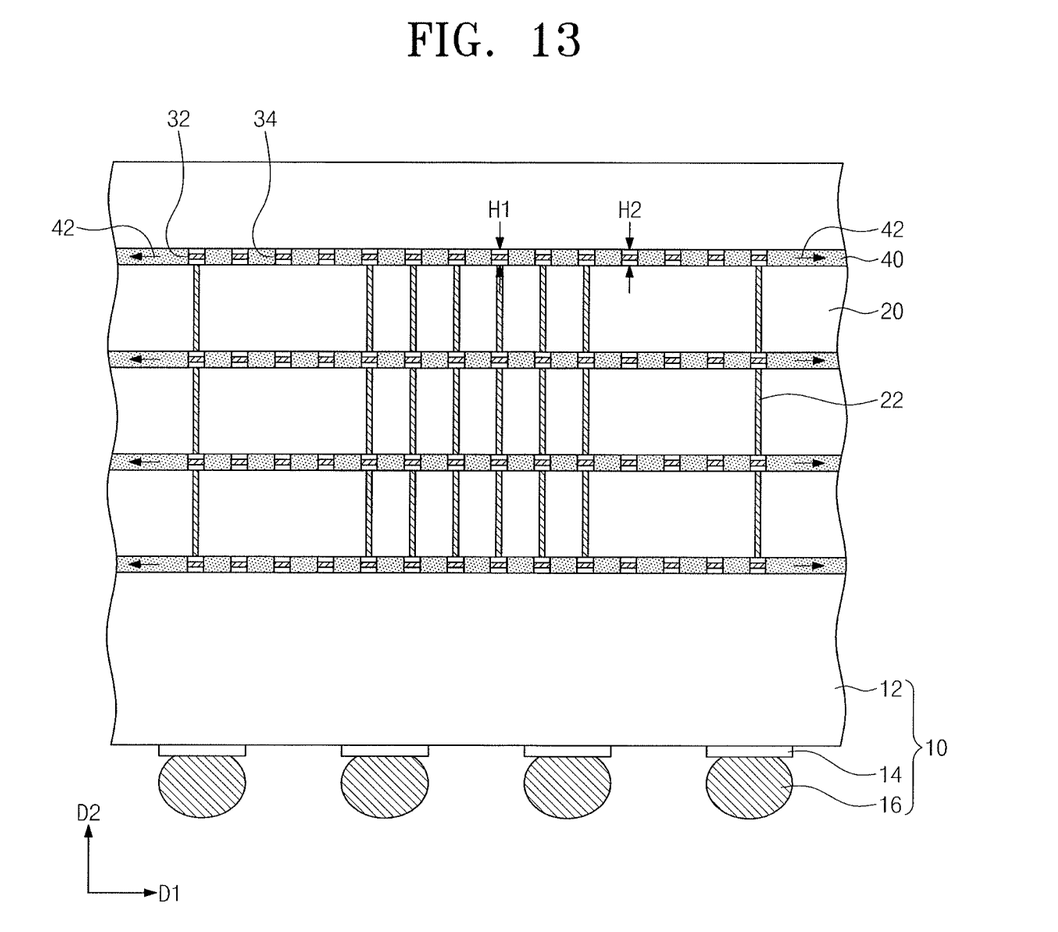
FIG. 13 illustrates a cross-sectional view of a semiconductor package according to some example embodiments.

FIG. 13 is a cross-sectional view illustrating a semiconductor package according to some example embodiments. In the present embodiment, the descriptions to the same elements and technical features as in the embodiments of FIGS. 1 to 12 will be omitted or mentioned briefly for the purpose of ease and convenience in explanation. In addition, the descriptions to the insulating pattern of FIGS. 1 to 12 will be omitted for the purpose of ease and convenience in explanation.

Referring to FIG. 13, a package substrate part 10 may be provided. The package substrate part 10 may include a package substrate 12, a contact pad 14 in contact with a bottom surface of the package substrate 12, and a package solder 16 in contact with a bottom surface of the contact pad 14.

The package substrate 12 may be a support substrate supporting chips 20. In some embodiments, the package substrate 12 may be a printed circuit board (PCB).

The contact pad 14 may provide a region on which the package solder 16 is disposed. In some embodiments, the contact pad 14 may include aluminum (Al) or copper (Cu). The semiconductor package according to some example embodiments may be mounted on an external electrical circuit substrate through the package solder 16. Thus, the package solder 16 may be an electrical connection path between the semiconductor package according to some embodiments and the external electrical circuit substrate. In some embodiments, the package solder 16 may include copper (Cu), aluminum (Al), silver (Ag), tin (Sn), gold (Au), or a tin-silver (SnAg) alloy.

A plurality of chips 20 may be provided on the package substrate 12. Four chips 20 are illustrated in FIG. 13 as an example. Each of the chips 20 may include any one of the substrates described with reference to FIGS. 1 to 12. A lower portion of each of the chips 20 may include an active region having electrical circuits (or an integrated circuit). Other chips 20 except the uppermost chip 20 may include through-electrodes 22. The through-electrode 22 may be the substantially same as any one of the through-electrodes 110 described with reference to FIGS. 1 to 12.

First bumps 32 may be provided between adjacent chips 20. The first bumps 32 may be the substantially same as the first bumps B1 described with reference to FIGS. 1 to 12. Each of the first bumps 32 may include the first solder, the first pillar, the first seed pattern, and the first barrier pattern.

The first bumps 32 may be electrically connected to the through-electrodes 22. The chips 20 may be electrically connected to the package substrate 12 through the through-electrodes 22 and the first bumps 32.

The first bumps 32 may be arranged in a first direction D1 parallel to a top surface of the chip 20. Thus, the first bumps 32 may be spaced apart from each other in the first direction D1. Here, a distance in the first direction D1 between a pair of first bumps 32 immediately adjacent to each other may be different from a distance in the first direction D1 between another pair of first bumps 32 adjacent to each other. For example, the distance in the first direction D1 between the pair of first bumps 32 immediately adjacent to each other may be smaller than the distance in the first direction D1 between the another pair of first bumps 32 adjacent to each other.

The first bumps 32 may have a first thickness H1 in a second direction D2 perpendicular to the top surface of the chip 20.

Second bumps 34 may be provided between the chips 20 and between the package substrate 12 and the chip 20 adjacent to the package substrate 12. The second bumps 34 may be the substantially same as the second bumps B2 described with reference to FIGS. 10 to 12.

The second bumps 34 and the first bumps 32 may be spaced apart from each other in the first direction D1 and may be arranged in the first direction D1 to constitute one row. The second bumps 34 may be disposed between the first bumps 32. For example, the second bumps 34 may be provided between the another pair of first bumps 32 adjacent to each other. The second pads 34 may be spaced apart from each other in the first direction D1 and may be arranged in the first direction D1.

The second bumps 34 may have a second thickness H2 in the second direction D2. In some embodiments, the second thickness H2 may be substantially equal to the first thickness H1. In certain embodiments, when the second bumps 34 are disposed on the insulating pattern as described with reference to FIGS. 1 to 9, the second thickness H2 may be smaller than the first thickness H1.

A space between the chips 20 and a space between the chip 20 and the package substrate 12 may be filled with an underfill 40. The underfill 40 may surround the first bumps 32 and the second bumps 34. A flow 42 of the underfill 40 may occur by heat and pressure applied in a process of adhering the chips 20. In some embodiments, the flow 42 of the underfill 40 may occur in a direction from the inside toward the outside of the semiconductor package.

Absent the presence of the second bumps 34, a shape of the solder of the first bump 32 may be varied by the flow 42 of the underfill 40, in which case electrical characteristics of the solder of the first bump 32 may be deteriorated. The first and second bumps 32 and 34 may resist the flow 42 of the underfill 40. Thus, influence of the flow 42 of the underfill 40 on the solders of the first bumps 32 may be less when the first and second bumps 32 and 34 exist together, relative to when only the first bumps 32 exist. The shape of the solder of the first bump 32 may be maintained by adjusting a distance between the second bumps 34 immediately adjacent to each other and a distance between the first and second bumps 32 and 34 immediately adjacent to each other. Thus, the solder of the first bump 32 may maintain desired electrical characteristics.

According to some example embodiments, the dummy bump may be provided the substrate, and the real bump and the dummy bump may constitute one row. The flow of the underfill may be reduced by the dummy bump. Thus, the variation of the solder of the real bump may be reduced or minimized, and a solder connection to the real bump may have desired electrical characteristics.

As described above, embodiments may provide a semiconductor package configured to inhibit a flow of an underfill. Embodiments may also provide a semiconductor package configured to inhibiting solder from being varied by a flow of an underfill. Embodiments may also provide a semiconductor package configured to improve electrical characteristics of solder.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a substrate;
   through-electrodes penetrating the substrate;
   first bumps spaced apart from each other in a first direction parallel to a top surface of the substrate, the first bumps being electrically connected to the through-electrodes, respectively;
   at least one second bump disposed between the first bumps, the at least one second bump being electrically floated; and
   an underfill covering the substrate, the first bumps, and the at least one second bump,
   wherein the first bumps and the at least one second bump constitute one row in the first direction, and
   wherein the at least one second bump is disposed at a higher level from the substrate than the first bumps.

2. The semiconductor package as claimed in claim 1, further comprising:
   an insulating pattern disposed between the substrate and the at least one second bump.

3. The semiconductor package as claimed in claim 2, wherein the insulating pattern has through-holes overlapping top surfaces of the through-electrodes, respectively, and
   wherein the first bumps are provided in the through-holes so as to be electrically connected to the through-electrodes, respectively.

4. The semiconductor package as claimed in claim 1, further comprising:
   a pad disposed between each of the through-electrodes and each of the first bumps.

5. The semiconductor package as claimed in claim 1, wherein the first bumps include:
   a pair of first bumps spaced apart from each other in the first direction by a first distance, the pair of first bumps being immediately adjacent to each other; and
   another pair of first bumps spaced apart from each other in the first direction by a second distance greater than the first distance,
   wherein the at least one second bump is provided between the another pair of first bumps.

6. The semiconductor package as claimed in claim 5, wherein the at least one second bump includes a plurality of second bumps,
   wherein the second bumps immediately adjacent to each other are spaced apart from each other in the first direction by a third distance, and
   wherein the third distance is substantially equal to or smaller than the first distance.

7. The semiconductor package as claimed in claim 6, wherein the first bump and the second bump immediately adjacent to each other are spaced apart from each other in the first direction by a fourth distance, and
   wherein the fourth distance is substantially equal to or smaller than the first distance.

8. The semiconductor package as claimed in claim 1, wherein the first bumps and the at least one second bump have thicknesses in a second direction perpendicular to the top surface of the substrate, and
   wherein the thicknesses of the first bumps are substantially equal to the thickness of the at least one second bump.

9. The semiconductor package as claimed in claim 1, wherein a top surface of the underfill is disposed at a substantially same level as or a higher level than a topmost portion of a top surface of the at least one second bump, based on a top surface of the substrate.

10. A semiconductor package, comprising:
    a substrate;
    through-electrodes penetrating the substrate;
    an insulating pattern on the substrate, the insulating pattern having through-holes exposing the through-electrodes, respectively;
    first bumps disposed on the substrate, and connected to the through-electrodes via the through-holes, respectively;
    at least one second bump disposed on the insulating pattern, and disposed between the first bumps immediately adjacent to each other, an entire bottom of the at least one second bump being in contact with the insulating pattern and not electrically connected to any through-electrodes; and
    an underfill covering the substrate, the insulating pattern, the first bumps, and the at least one second bump,
    wherein the at least one second bump is electrically insulated from the through-electrodes by the insulating pattern.

11. The semiconductor package as claimed in claim 10, wherein a level of a bottom surface of the at least one second bump from a top surface of the substrate is higher than levels of bottom surfaces of the first bumps from the top surface of the substrate.

12. The semiconductor package as claimed in claim 10, wherein the first bumps spaced are apart from each other in a first direction parallel to a top surface of the substrate, and
    wherein the first bumps and the at least one second bump constitute one row in the first direction.

13. The semiconductor package as claimed in claim 10, further comprising:
    a pad disposed between each of the through-electrodes and each of the first bumps.

14. The semiconductor package as claimed in claim 13, wherein a thickness of the insulating pattern is greater than a thickness of the pad.

15. The semiconductor package as claimed in claim 10, wherein the first bumps include:
    a pair of first bumps spaced apart from each other in a first direction by a first distance, the pair of first bumps being immediately adjacent to each other; and
    another pair of first bumps spaced apart from each other in the first direction by a second distance greater than the first distance,
    wherein the at least one second bump is provided between the another pair of first bumps.

16. The semiconductor package as claimed in claim 15, wherein the at least one second bump includes a plurality of second bumps,
    wherein the second bumps immediately adjacent to each other are spaced apart from each other in the first direction by a third distance, and
    wherein the third distance is substantially equal to or smaller than the first distance.

17. The semiconductor package as claimed in claim 16, wherein the first bump and the second bump immediately adjacent to each other are spaced apart from each other in the first direction by a fourth distance, and
wherein the fourth distance is substantially equal to or smaller than the first distance.

18. The semiconductor package as claimed in claim 10, wherein the first bumps and the at least one second bump have thicknesses in a second direction perpendicular to a top surface of the substrate, and
wherein the thicknesses of the first bumps are substantially equal to the thickness of the at least one second bump.

19. The semiconductor package as claimed in claim 10, wherein a top surface of the underfill is disposed at a substantially same level as or a higher level than a topmost portion of a top surface of the at least one second bump, based on a top surface of the substrate.

20. A semiconductor package, comprising:
a substrate;
through-electrodes penetrating the substrate;
first bumps spaced apart from each other in a first direction parallel to a top surface of the substrate, the first bumps being electrically connected to the through-electrodes, respectively;
at least one second bump disposed between the first bumps, the at least one second bump being electrically insulated from the through-electrodes;
an insulating pattern between the substrate and the at least one second bump; and
an underfill covering the substrate, the first bumps, and the at least one second bump,
wherein the first bumps and the at least one second bump constitute one row in the first direction,
wherein the at least one second bump is disposed at a higher level from the substrate than the first bumps, and
wherein the through-electrodes are only connected to the first bumps from among the first and second bumps.

\* \* \* \* \*